United States Patent
Ikeda et al.

(10) Patent No.: US 8,952,722 B2
(45) Date of Patent: Feb. 10, 2015

(54) PROGRAMMABLE LOGIC DEVICE AND METHOD FOR DRIVING PROGRAMMABLE LOGIC DEVICE

(71) Applicant: Semiconductor Energy Laboratory Co., Ltd., Atsugi-shi, Kanagawa-ken (JP)

(72) Inventors: Takayuki Ikeda, Atsugi, Kanagawa (JP); Yoshiyuki Kurokawa, Sagamihara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/051,782

(22) Filed: Oct. 11, 2013

(65) Prior Publication Data
US 2014/0103958 A1    Apr. 17, 2014

(30) Foreign Application Priority Data

Oct. 17, 2012   (JP) ................................. 2012-230161

(51) Int. Cl.
| | |
|---|---|
| G06F 7/38 | (2006.01) |
| H03K 19/173 | (2006.01) |
| H03K 19/00 | (2006.01) |
| H03K 19/177 | (2006.01) |

(52) U.S. Cl.
CPC ...... *H03K 19/0008* (2013.01); *H03K 19/17772* (2013.01); *H03K 19/1776* (2013.01); *H03K 19/17748* (2013.01)
USPC ................................. 326/38; 326/39; 326/40

(58) Field of Classification Search
None
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Anh Tran
(74) *Attorney, Agent, or Firm* — Fish & Richardson P.C.

(57) ABSTRACT

Configuration is performed in accordance with a plurality of states when power supply voltage is supplied intermittently. At the time of start of supply of power supply voltage with configuration, a programmable logic device is sequentially changed into a first state where configuration data is not set in a configuration memory, a second state where the configuration memory is initialized, and a third state where the configuration data can be set in the configuration memory. At the time of start of supply of power supply voltage without configuration, the programmable logic device is sequentially changed into a fourth state where the configuration data is not set in the configuration memory and the third state. The first to fourth states are switched to any one of the states by control of a first state signal and a second state signal.

18 Claims, 10 Drawing Sheets

(56) References Cited

U.S. PATENT DOCUMENTS

| | | |
|---|---|---|
| 6,172,521 B1 | 1/2001 | Motomura |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148320 A1* | 6/2010 | Nishioka ............... 326/39 |
| 2011/0175646 A1 | 7/2011 | Takemura et al. |
| 2012/0293200 A1 | 11/2012 | Takemura |
| 2012/0293201 A1 | 11/2012 | Fujita et al. |
| 2012/0293202 A1 | 11/2012 | Nishijima et al. |
| 2012/0293206 A1 | 11/2012 | Yoneda et al. |
| 2012/0293209 A1 | 11/2012 | Takewaki |
| 2012/0293242 A1 | 11/2012 | Kato |
| 2013/0207170 A1 | 8/2013 | Kurokawa |
| 2013/0229205 A1* | 9/2013 | Yoneda ............... 326/39 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-285014 A | 10/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-166255 A | 7/2010 |
| WO | 20041114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous I—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

(56) References Cited

OTHER PUBLICATIONS

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn—Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of The 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English Translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

* cited by examiner

PROGRAMMABLE LOGIC DEVICE AND METHOD FOR DRIVING PROGRAMMABLE LOGIC DEVICE

BACKGROUND OF THE INVENTION

1. Field of the Invention

The present invention relates to semiconductor devices. In particular, the present invention relates to methods for driving programmable logic devices.

Unlike a normal integrated circuit in which all the circuits are fixed at the time of manufacture, a programmable logic device (PLD) can function with an intended circuit structure set by a user at the time of actual use after shipment. Examples of such user-programmable devices are small-scale logics such as a programmable array logic (PAL) and a generic array logic (GAL) and large-scale logics such as a complex programmable logic device (CPLD) and a field programmable gate array (FPGA). In this specification, such devices are called PLDs.

2. Description of the Related Art

PLDs show flexibility in a reduction in development period and a change in design specification compared to conventional application specific integrated circuits (ASICs) and gate arrays, which is advantageous. In recent years, PLDs have been rapidly spread in electronic devices and the like coupled with development of microfabrication technique.

A PLD includes, for example, a plurality of logic elements (hereinafter referred to as LEs) and wirings between the LEs. The function of the PLD can be changed by changing the functions of the LEs or a connection path between the LEs.

The function of the LE can be specified by, for example, setting data (configuration data) for determining the function of the LE in configuration memories included in a look-up table (hereinafter referred to as an LUT) and a multiplexer (hereinafter referred to as an MUX). In addition, the connection path between the LEs can be specified by setting configuration data for determining the state of a switch provided between wirings in a configuration memory storing the on or off state of the switch.

Dynamic reconfigurable PLDs attract attention. Among the dynamic reconfigurable PLDs, multi-context PLDs attract attention. A multi-context PLD achieves dynamic reconfiguration by temporarily storing configuration data in a configuration memory storing the state of an LE or a switch.

Patent Document 1 discloses a dynamic reconfigurable PLD in which pieces of configuration data corresponding to a plurality of circuit structures are stored in different addresses in a dynamic random access memory (DRAM) and a configuration memory is a static random access memory (SRAM).

A memory element including a DRAM or an SRAM has a problem of an increase in power consumption due to an increase in leakage current between power supply lines coupled with development of microfabrication technique.

The problem of an increase in power consumption is tried to be solved by technique for reducing power consumption, such as power gating technique in which power supply is stopped in a short period during which supply of power supply voltage is not needed. For example, Patent Document 2 discloses a configuration memory that includes a flip-flop and a nonvolatile memory and can retain configuration data even when supply of power supply voltage is stopped.

REFERENCE

Patent Document 1: Japanese Published Patent Application No. 10-285014

Patent Document 2: Japanese Published Patent Application No. 2010-166255

SUMMARY OF THE INVENTION

A PLD including a nonvolatile memory as disclosed in Patent Document 2 needs to have a plurality of states in intermittent supply of power supply voltage. For example, the PLD needs to have a state where supply of power supply voltage with configuration is started and a state where supply of power supply voltage without configuration is started.

In addition, the state where the supply of power supply voltage with configuration is started can be subdivided into a plurality of states: a state where supply of power supply voltage with configuration is started from an initial state and a state where supply of power supply voltage with reconfiguration is started, for example.

Note that to set configuration data in a configuration memory is called configuration. Further, to reset configuration data in a configuration memory for updating the configuration data is called reconfiguration.

Specifically, the state where the supply of power supply voltage without configuration is started means a state where supply of power supply voltage to a PLD is started after configuration data is stored in a configuration memory. In addition, the state where the supply of power supply voltage with configuration is started from an initial state means a state where supply of power supply voltage to a PLD is started when configuration data is not stored in a configuration memory or is not determined right after shipment, for example. Further, the state where the supply of power supply voltage with reconfiguration is started means a state where supply of power supply voltage to a PLD is started when configuration data is reset in a configuration memory for updating the configuration data.

In order to effectively utilize the features of a PLD including a nonvolatile memory, it is necessary to control the PLD in accordance with a plurality of states, for example, states subdivided in accordance with a state at the time of supply of power supply voltage or states subdivided in accordance with the set state of configuration data, as described above.

In view of the problems, it is an object of one embodiment of the present invention to propose a method for driving a programmable logic device performing configuration or reconfiguration in accordance with a plurality of states when power supply voltage is supplied intermittently by using a nonvolatile memory.

One embodiment of the present invention is a method for driving a programmable logic device that includes a logic element provided with a configuration memory and can stop or start supply of power supply voltage. At the time of start of supply of power supply voltage with configuration, the programmable logic device is sequentially changed into a first state where configuration data is not set in the configuration memory, a second state where the configuration memory is initialized, and a third state where the configuration data can be set in the configuration memory. At the time of start of supply of power supply voltage without the configuration, the programmable logic device is sequentially changed into a fourth state where the configuration data is not set in the configuration memory and the third state. The first to fourth states are switched to any one of the states by control of a first state signal and a second state signal.

One embodiment of the present invention is preferably a method for driving a programmable logic device where transition of the first to fourth states is performed in accordance with a change in the first state signal or the second state signal.

One embodiment of the present invention is preferably a method for driving a programmable logic device where the first state signal has a first level and the second state signal has a second level in the first state, the first state signal has the second level and the second state signal has the second level in the second state, the first state signal has the second level and the second state signal has the first level in the third state, and the first state signal has the first level and the second state signal has the first level in the fourth state.

One embodiment of the present invention is preferably a method for driving a programmable logic device where supply of power supply voltage with configuration is started after power supply voltage is supplied to a storage circuit storing the configuration data.

One embodiment of the present invention is preferably a method for driving a programmable logic device where at the time of start of supply of power supply voltage without configuration, power supply voltage is continuously supplied to a storage circuit storing the configuration data in a period during which supply of power supply voltage to the programmable logic device is stopped.

According to one embodiment of the present invention, it is possible to provide a method for driving a programmable logic device performing configuration or reconfiguration in accordance with a plurality of states when power supply voltage is supplied intermittently by using a nonvolatile memory.

According to one embodiment of the present invention, it is also possible to provide a method for driving a highly reliable programmable logic device by changing the programmable logic device into another state in accordance with a change in the first state signal or the second state signal when the first state signal and the second state signal are controlled.

DETAILED DESCRIPTION OF THE INVENTION

Figure 1:
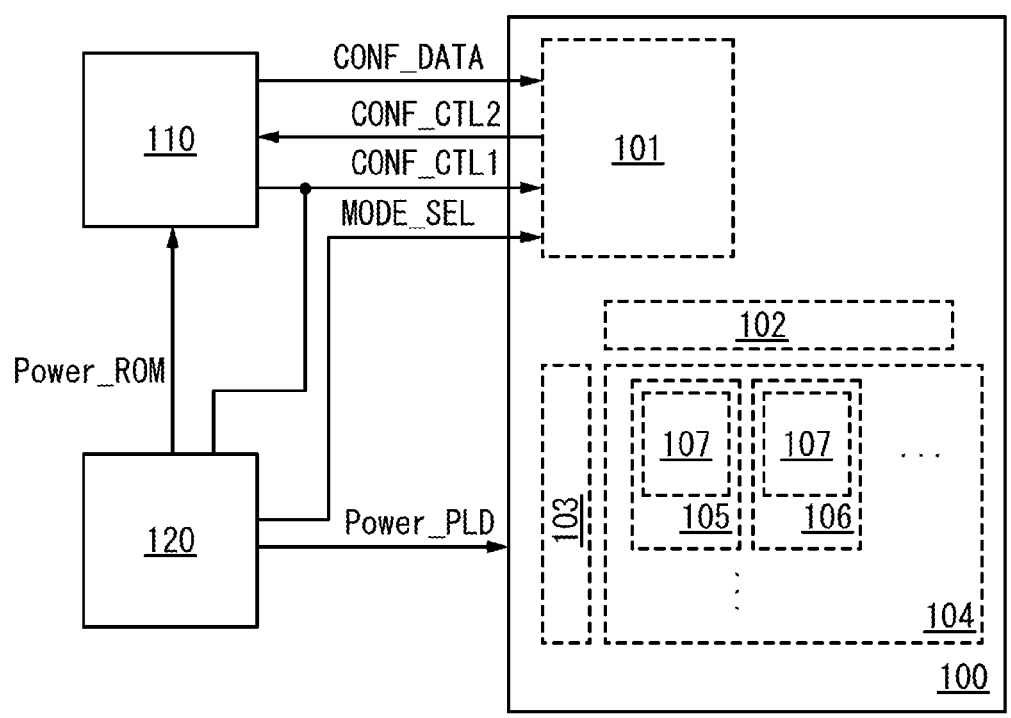
FIG. 1 is a block diagram of a PLD.

Embodiments will be described below with reference to the drawings. Note that the embodiments can be implemented in various different ways and it will be readily appreciated by those skilled in the art that modes and details of the embodiments can be changed in various ways without departing from the spirit and scope of the present invention. The present invention therefore should not be construed as being limited to the following description of the embodiments.

In the drawings, the size, the layer thickness, or the region is exaggerated for clarity in some cases. Thus, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate (a gate terminal or a gate electrode), a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a region that functions as a source or a region that functions as a drain is not referred to as a source or a drain in some cases. In that case, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

Note that in this specification, the expression "A and B are connected" means the case where "A and B are electrically connected" in addition to the case where "A and B are directly connected". Here, the expression "A and B are electrically connected" means the case where electric signals can be transmitted and received between A and B when an object having any electric action exists between A and B.

Note that in this specification, terms for describing arrangement, such as "over" and "under", are used for convenience for describing the positional relation between components with reference to drawings. Further, the positional relation between components is changed as appropriate in accordance with a direction in which each component is described. Thus, there is no limitation on terms used in this specification, and description can be made appropriately depending on the situation.

Note that the positional relations of circuit blocks in block diagrams are specified for description, and even in the case where different circuit blocks have different functions, the different circuit blocks might be provided in an actual circuit or an actual region so that different functions are achieved in the same circuit or the same region. The functions of circuit blocks in block diagrams are specified for description, and even in the case where one circuit block is illustrated, blocks might be provided in an actual circuit or an actual region so that processing performed by one circuit block is performed by a plurality of circuit blocks.

Embodiment 1

This embodiment is described with reference to drawings in the following order:
1. Block Diagram of PLD
2. Method for Driving PLD
3. Modification of Method for Driving PLD
4. Details of Components in PLD
    4-1. Structure of Logic Array
    4-2. Structure of Switch Portion
    4-3. Structure of LE
    4-4. Structure of Configuration Memory
    4-5. Features of Oxide Semiconductor Transistor
5. Action and Effect of Method for Driving PLD Disclosed in This Specification.

<1. Block Diagram of PLD>

First, a block diagram of a PLD is described.

A block diagram in FIG. 1 illustrates a PLD operated by a method for driving a PLD according to one embodiment of the present invention. FIG. 1 illustrates a PLD 100, a storage circuit 110, and a power supply control circuit 120.

The PLD 100 includes a PLD control circuit 101, a data line driver circuit 102, a word line driver circuit 103, and a logic array 104.

The logic array 104 includes an LE 105 and a switch portion 106. The LE 105 and the switch portion 106 each include a configuration memory 107.

The PLD control circuit 101 generates signals for controlling the data line driver circuit 102 and the word line driver circuit 103 based on external signals. For example, in the case where the data line driver circuit 102 and the word line driver circuit 103 each include a shift register, the PLD control circuit 101 generates signals such as clock signals and start pulses.

The data line driver circuit 102 and the word line driver circuit 103 control writing of configuration data to the configuration memory 107.

The data line driver circuit 102 is connected to a plurality of data lines. The data line driver circuit 102 includes, for example, a shift register. The data line is a wiring for supplying configuration data to each configuration memory 107.

The word line driver circuit 103 is connected to a plurality of word lines. The word line driver circuit 103 includes, for example, a shift register. The word line is a wiring for supplying a signal used for taking configuration data supplied to the data line in each configuration memory 107.

Note that the configuration memories 107 are logically arranged in a matrix in the logic array 104. In that case, the word line driver circuit 103 selects a row to which configuration data is written, and the data line driver circuit 102 selects a column to which configuration data is written. Then, the configuration data can be written to the selected configuration memory 107.

The configuration memory 107 includes a nonvolatile memory. Thus, even when supply of power supply voltage to the PLD 100 is stopped or started, configuration data that has been set can be retained. Consequently, the LE 105 and the switch portion 106 each including the configuration memory 107 can maintain the function that has been set.

The expression "arranged in a matrix" means the case where the configuration memories 107 are arranged in a row direction and a column direction. Note that examples of the nonvolatile memory included in the configuration memory 107 are an electrically programmable read only memory (EPROM), an electrically erasable and programmable read only memory (EEPROM), a floating gate EEPROM, a ferroelectric random access memory (FeRAM), a magnetoresistive random access memory (MRAM), a phase-change random access memory (PRAM), and a resistive random access memory (ReRAM).

The logic array 104 includes the plurality of LEs 105 and the switch portion 106 for switching the connection path between the LEs 105. The LE 105 and the switch portion 106 each include the configuration memory 107. The function of the PLD 100 can be changed by changing the function of the LE or the connection path between the LEs in accordance with configuration data written to the configuration memory 107.

The LE 105 includes, for example, an LUT and an MUX. Data in the LUT can be specified by setting configuration data stored in the configuration memory. In addition, selection data on input signals in the MUX can be specified by setting configuration data stored in the configuration memory The switch portion 106 can change the connection path between the LEs by switching the connection between wirings provided in the logic array 104. The connection between wirings can be specified by setting configuration data stored in the configuration memory.

The logic array 104 can include an input-output terminal IO in addition to the LE 105 and the switch portion 106. The input-output terminal IO is an input pin or an output pin depending on the setting. In the case of the input pin, functions such as synchronization or non-synchronization of an input signal are set. In the case of the output pin, functions such as availability of high impedance, availability of an open drain, and synchronization or non-synchronization of an output signal are set. In the input-output terminal TO, the functions of the input pin or the output pin are determined by configuration data stored in the configuration memory A high power supply potential VDD_PLD and a low power supply potential VSS_PLD are applied to the PLD 100 through a power supply line Power_PLD constituted of a plurality of wirings extended from the power supply control circuit 120, so that power supply voltage is supplied to the PLD 100. Note that to stop supply of power supply voltage to the PLD 100 means, for example, to change the potential of a wiring to which the high power supply potential VDD_PLD is applied into the low power supply potential VSS_PLD. Alternatively, to stop the supply of power supply voltage to the PLD 100 means to provide a switch between the PLD 100 and wirings to which the high power supply potential VDD_PLD and the low power supply potential VSS_PLD are applied and to turn off the switch. Note that the low power supply potential VSS_PLD may be a ground potential GND.

The storage circuit 110 includes a read only memory (ROM). The ROM stores configuration data. Configuration data is output to the PLD control circuit 101 through a signal line CONF_DATA. The configuration data is output in response to control with the PLD control circuit 101 or switching of the supply of power supply voltage to the PLD 100. In addition, the storage circuit 110 inputs a first configuration control signal to the PLD control circuit 101 through a signal line CONF_CTL1. Further, a second configuration control signal is input to the storage circuit 110 from the PLD control circuit 101 through a signal line CONF_CTL2.

Note that the storage circuit 110 may be a rewritable nonvolatile memory. Examples of the rewritable nonvolatile memory are an EPROM, an EEPROM, a floating gate EEPROM, a ferroelectric random access memory, a magnetoresistive random access memory, a phase-change random access memory, and a resistive random access memory.

The first configuration control signal is a signal for making the storage circuit 110 give the PLD control circuit 101 notice that configuration data can be transmitted. The second configuration control signal is a signal for making the PLD control circuit 101 give the storage circuit 110 notice of request to transmit configuration data. The first configuration control signal output from the storage circuit 110 to the PLD control circuit 101 is preferably switched from an L level to an H level in response to start of the supply of power supply voltage to the storage circuit 110.

Note that the storage circuit 110 preferably outputs configuration data to the PLD control circuit 101 when the second configuration control signal is input through the signal line CONF_CTL2. Further, it is effective for the storage circuit 110 to output a clock signal in synchronization with configuration data when the configuration data is output to the PLD control circuit 101. With such a structure, it is possible to constitute the PLD 100 and the storage circuit 110 with a small number of signal lines.

Further, it is effective for the PLD control circuit 101 to output the second configuration control signal right after reception of the first configuration control signal. In particular, when the power supply control circuit 120 has a function of controlling timing of changing configuration data, it is easily possible to change the configuration data while the PLD 100 operates. This allows flexibility in changing the function of the PLD 100.

A high power supply potential VDD_ROM and a low power supply potential VSS_ROM are applied to the storage circuit 110 through a power supply line Power_ROM constituted of a plurality of wirings extended from the power supply control circuit 120, so that power supply voltage is supplied to the storage circuit 110. Note that to stop supply of power supply voltage to the storage circuit 110 means, for example, to change the potential of a wiring to which the high power supply potential VDD_ROM is applied into the low power supply potential VSS_ROM. Alternatively, to stop the supply of power supply voltage to the storage circuit 110 means to provide a switch between the storage circuit 110 and wirings to which the high power supply potential VDD_ROM and the low power supply potential VSS_ROM are applied and to turn off the switch. Note that the low power supply potential VSS_ROM may be the ground potential GND.

The power supply control circuit 120 is a circuit for switching stop and restart of the supply of power supply voltage to the PLD 100 and the storage circuit 110. The power supply control circuit 120 outputs a first state signal MODE1 and a second state signal MODE2 to the PLD control circuit 101 through a signal line MODE_SEL. In addition, the power supply control circuit 120 inputs the first configuration control signal to the PLD control circuit 101 through the signal line CONF_CTL1.

The first state signal MODE1 and the second state signal MODE2 are each controlled with two values: an H level (also referred to as a first level) and an L level (also referred to as a second level). The PLD 100 is switched to a plurality of states in accordance with possible two states of the first state signal MODE1 and the second state signal MODE2.

When the first configuration control signal is not transmitted from the storage circuit 110 to the PLD control circuit 101, the first configuration control signal is transmitted to the PLD control circuit 101 not from the storage circuit 110 but from the power supply control circuit 120. For example, when the first configuration control signal is switched from an L level to an H level in response to start of the supply of power supply voltage to the storage circuit 110, the first configuration control signal is not transmitted if power supply voltage is continuously supplied to the storage circuit 110. Consequently, the first configuration control signal is preferably transmitted to the PLD control circuit 101 not from the storage circuit 110 but from the power supply control circuit 120.

Further, it is effective for the PLD control circuit 101 to output the second configuration control signal right after reception of the first configuration control signal. In particular, when the power supply control circuit 120 has a function of controlling timing of changing configuration data, it is easily possible to change the configuration data while the PLD 100 operates. This allows flexibility in changing the function of the PLD 100.

Note that in the following description, the PLD 100 can be set in first to fourth states in accordance with the two values of the first state signal MODE1 and the second state signal MODE2. The specific two values of the first state signal MODE1 and the second state signal MODE2 for specifying the first to fourth states are as follows.

The PLD 100 can be set in the first state when the first state signal MODE1 is at an H level and the second state signal MODE2 is at an L level. The first state is a state where configuration data is not set in the configuration memory.

The PLD 100 can be set in the second state when the first state signal MODE1 is at an L level and the second state signal MODE2 is at an L level. The second state is a state where configuration data having the same value is set in all the configuration memories from a state where configuration data is not stored in the configuration memory or is not determined right after shipment, for example.

Note that to set configuration data having the same value in all the configuration memories as in the second state means to initialize the configuration memory.

The PLD 100 can be set in the third state when the first state signal MODE1 is at an L level and the second state signal MODE2 is at an H level. The third state is a state where configuration data can be set in the configuration memory or configuration data can be reset in the configuration memory for updating the configuration data.

The PLD 100 can be set in the fourth state when the first state signal MODE1 is at an H level and the second state signal MODE2 is at an H level. Like the first state, the fourth state is a state where configuration data is not set in the configuration memory.

<2. Method for Driving PLD>

Next, start of the supply of power supply voltage to the PLD 100 with the use of the first state signal MODE1 and the second state signal MODE2 output from the power supply control circuit 120 is described with reference to timing charts.

Figure 2A:
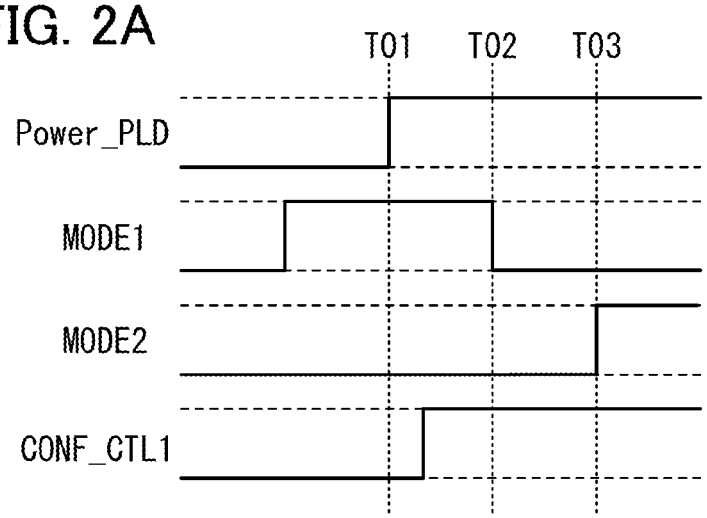
FIGS. 2A to 2C each illustrate a method for driving a PLD.
Figure 2B:
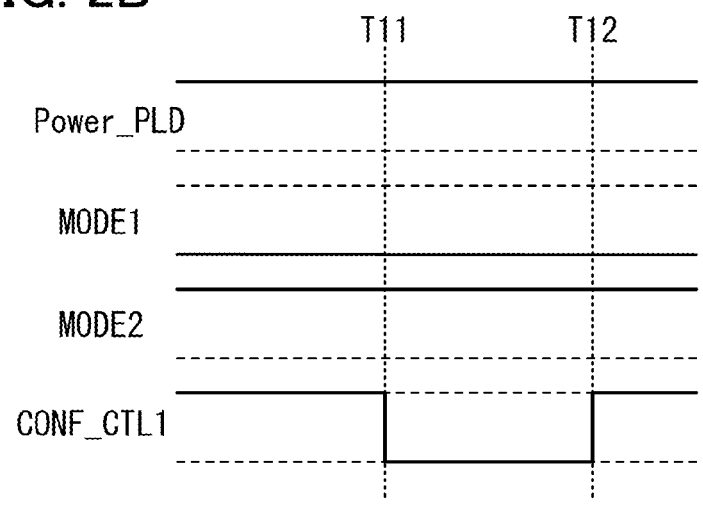
Figure 2C:
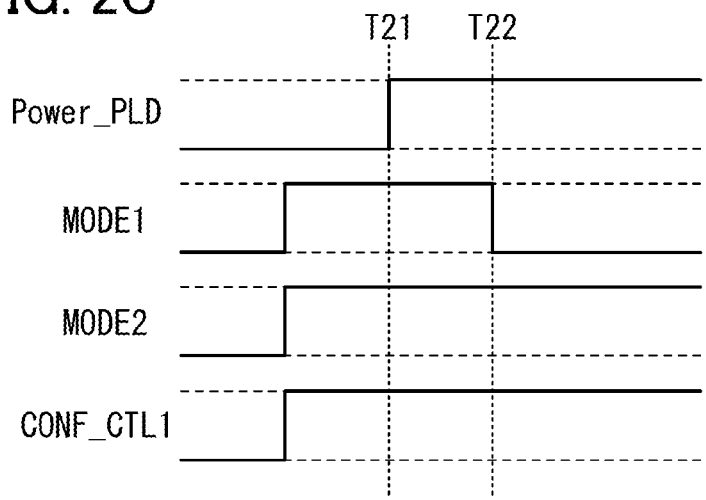

Note that for illustrative purposes, in timing charts in FIGS. 2A to 2C, the supply of power supply voltage to the PLD 100 is started by switching the potential of the power supply line Power_PLD from an L level to an H level.

First, subdivision of a plurality of states by switching of the first state signal MODE1 and the second state signal MODE2 is described.

FIG. 2A illustrates a state where supply of power supply voltage with configuration is started, in particular, a state where supply of power supply voltage with configuration is started from an initial state. FIG. 2B illustrates a state where power supply voltage is continuously supplied and reconfiguration is performed. FIG. 2C illustrates a state where supply of power supply voltage without configuration is started.

In the timing chart in FIG. 2A illustrating the state where the supply of power supply voltage with configuration is started from the initial state, the PLD is sequentially changed into a first state where configuration data is not set in the configuration memory 107, a second state where the configuration memory 107 is initialized, and a third state where the configuration data can be set in the configuration memory 107.

In FIG. 2A, the supply of power supply voltage is started at time T01. At this time, the power supply control circuit 120 inputs a signal to the PLD control circuit 101 for setting the first state signal MODE1 at an H level and setting the second state signal MODE2 at an L level so that the PLD is set in the first state where configuration data is not set in the configuration memory 107. The PLD control circuit 101 controls the data line driver circuit 102 and the word line driver circuit 103 in response to the signal.

Specifically, in the first state, the configuration memory 107 is not selected by a signal of a word line connected to the word line driver circuit 103, and configuration data is not output by a signal of a data line connected to the data line driver circuit 102.

Note that in order to stabilize the supply of power supply voltage, it is preferable that the first state signal MODE1 be set at an H level and that the second state signal MODE2 be set at an L level before the time T01. With such a structure, changes in the first state signal MODE1 and the second state signal MODE2 and malfunction due to deviation of change time that is caused by the supply of power supply voltage at the time T01 can be prevented.

In the first state, another circuit portion of the PLD 100, for example, the PLD control circuit 101 is preferably initialized. With such a structure, malfunction of the PLD 100 due to an unnecessary input-output signal at the time T01 can be prevented more reliably.

In addition, in the first state, the shift registers included in the data line driver circuit 102 and the word line driver circuit 103 are preferably initialized. In that case, the first state signal MODE1 is preferably used as a reset signal for initializing the shift registers. With such a structure, a circuit for generating a reset signal, a wiring for supplying a reset signal, and the like can be omitted.

Note that the first state signal MODE1 is preferably a control signal for recovering data backed up from a volatile storage portion to a nonvolatile storage portion included in a data backup-type memory. With such a structure, a circuit for generating a control signal, a wiring for supplying a control signal, and the like can be omitted.

Next, in FIG. 2A, at time T02, the power supply control circuit 120 inputs a signal to the PLD control circuit 101 for setting the first state signal MODE1 at an L level and setting the second state signal MODE2 at an L level so that the PLD is set in the second state where configuration data having the same value is set in all the configuration memories 107. The PLD control circuit 101 controls the data line driver circuit 102 and the word line driver circuit 103 in response to the signal.

Specifically, in the second state, the configuration memory 107 is selected by a signal of the word line connected to the word line driver circuit 103, a signal of the data line connected to the data line driver circuit 102 is set to an L-level signal that is an initial value, and configuration data having the same value is set in all the configuration memories 107. That is, the configuration memories 107 are initialized.

Note that by setting the initial value, unnecessary short-circuit between wirings in the PLD 100 can be prevented. For example, when the plurality of switch portions 106 are turned on, output signals having different potentials are short-circuited. In order to prevent this short-circuit, it is preferable to turn off all the switch portions 106. Alternatively, it is effective to write an L level that is the initial value only to a configuration memory necessary for achieving the above object. Note that the initial value may be an H-level signal.

Next, in FIG. 2A, at time T03, the power supply control circuit 120 inputs a signal to the PLD control circuit 101 for setting the first state signal MODE1 at an L level and setting the second state signal MODE2 at an H level so that the PLD is set in the third state where configuration data can be set in the configuration memory 107. The PLD control circuit 101 controls the data line driver circuit 102 and the word line driver circuit 103 in response to the signal.

Specifically, in the third state, when a clock signal and a start pulse are supplied, the configuration memory 107 can be selected by the word line driver circuit 103 through a word line. In addition, when a clock signal and a start pulse are supplied, configuration data can be set in the configuration memory 107 by the data line driver circuit 102 through a data line.

Note that it is preferable that the PLD control circuit 101 have a function of starting supply of a clock signal and a start pulse to the word line driver circuit 103 and starting supply of a clock signal, a start pulse, and configuration data to the data line driver circuit 102 with switching from an L level to an H level of the signal line CONF_CTL1 supplied with the first configuration control signal used as a trigger signal. With such a structure, it is possible to prevent malfunction due to signal delay or the like without an increase in the number of signals input. Note that in FIG. 2A, in a period from the time T01 to the time T02, the first configuration control signal is switched from an L level to an H level; however, the first configuration control signal may be switched from an L level to an H level in another period as long as the PLD control circuit 101 can effectively detect signal switching.

In the timing chart in FIG. 2B illustrating the state where power supply voltage is continuously supplied and reconfiguration is performed, the third state where configuration data can be set in the configuration memory 107 is maintained.

In a period from time T11 to time T12 in FIG. 2B, the power supply control circuit 120 inputs a signal to the PLD control circuit 101 for setting the first state signal MODE1 at an L level and setting the second state signal MODE2 at an H level so that the PLD is set in the third state. Then, while the PLD is kept in the third state, the first configuration control signal is changed into an L-level signal at the time T11. When the first configuration control signal is changed into an H-level signal at the time T12, configuration can be started with switching from an L level to an H level of the signal line CONF_CTL1 supplied with the first configuration control signal used as a trigger signal. Specifically, the signal line CONF_CTL1 is preferably switched from an L level to an H level based on switching of the supply of power supply voltage to the storage circuit 110 from a stop state to a start state or operation of the PLD control circuit 101. In addition, by specifying a context on which configuration is performed as appropriate, desired configuration data can be set in the configuration memory 107.

Note that after the first configuration control signal is effectively detected, the PLD control circuit 101 preferably outputs the second configuration control signal to the storage circuit 110 with the signal used as a trigger signal. After the second configuration control signal is detected, the storage circuit 110 preferably outputs configuration data to the PLD 100 with the signal used as a trigger signal. With such a structure, the PLD 100, the storage circuit 110, and the power supply control circuit 120 can be easily constituted.

In the timing chart in FIG. 2C illustrating the state where the supply of power supply voltage without configuration is started, the PLD is sequentially changed into a fourth state where configuration data is not set in the configuration memory 107 and the third state.

In FIG. 2C, the supply of power supply voltage is started at time T21. At this time, the power supply control circuit 120 inputs a signal to the PLD control circuit 101 for setting the first state signal MODE1 at an H level and setting the second state signal MODE2 at an H level so that the PLD is set in the fourth state where configuration data is not set in the configuration memory 107. The PLD control circuit 101 controls the data line driver circuit 102 and the word line driver circuit 103 in response to the signal.

Specifically, in the fourth state, the configuration memory 107 is not selected by a signal of a word line connected to the word line driver circuit 103, and configuration data is not output by a signal of a data line connected to the data line driver circuit 102.

Note that in order to stabilize the supply of power supply voltage, it is preferable that the first state signal MODE1 be set at an H level and that the second state signal MODE2 be set at an H level before the time T21. With such a structure, malfunction due to signal delay or the like at the time T21 can be prevented.

While the data line driver circuit 102 and the word line driver circuit 103 are in the fourth state, another circuit portion of the PLD 100, for example, the PLD control circuit 101 is preferably initialized. With such a structure, malfunction of the PLD 100 due to an unnecessary input-output signal at the time T21 can be prevented more reliably.

In addition, while the data line driver circuit 102 and the word line driver circuit 103 are in the fourth state, the shift registers included in the data line driver circuit 102 and the word line driver circuit 103 are preferably initialized. In that case, the first state signal MODE1 is preferably used as a reset signal for initializing the shift registers. With such a structure, a circuit for generating a reset signal, a wiring for supplying a reset signal, and the like can be omitted.

When the supply of power supply voltage is restarted, recovery operation of the nonvolatile memory included in the configuration memory 107 is preferably performed while the data line driver circuit 102 and the word line driver circuit 103 are in the fourth state. At this time, in the PLD 100, the signal line CONF_CTL1 is switched from an L level to an H level; however, the PLD 100 does not respond because power supply voltage is not supplied to the PLD 100.

Next, in FIG. 2C, at time T22, the power supply control circuit 120 inputs a signal to the PLD control circuit 101 for setting the first state signal MODE1 at an L level and setting the second state signal MODE2 at an H level so that the PLD is set in the third state where configuration data can be set in the configuration memory 107. The PLD control circuit 101 controls the data line driver circuit 102 and the word line driver circuit 103 in response to the signal.

Specifically, in the third state, when a clock signal and a start pulse are supplied, the configuration memory 107 can be selected by the word line driver circuit 103 through a word line. In addition, when a clock signal and a start pulse are supplied, configuration data can be set in the configuration memory 107 by the data line driver circuit 102 through a data line.

Note that the first to fourth states are set by changing the first state signal MODE1 or the second state signal MODE2. With such a structure, transition from the first state to the second state may be performed by changing only the first state signal MODE1. Transition from the second state to the third state may be performed by changing only the second state signal MODE2. Transition from the fourth state to the third state may be performed by changing only the first state signal MODE1. Thus, in the middle of state transition, it is possible to prevent malfunction due to deviation of change time in the first state signal MODE1 and the second state signal MODE2 that is caused when the first state signal MODE1 and the second state signal MODE2 are changed.

Note that by applying the way of thinking, for example, two values of the first state signal MODE1 and the second state signal MODE2 for specifying the first to fourth states can be set as follows.

The PLD 100 is set in the first state when the first state signal MODE1 is at an L level and the second state signal MODE2 is at an L level. The PLD 100 is set in the second state when the first state signal MODE1 is at an L level and the second state signal MODE2 is at an H level. The PLD 100 is set in the third state when the first state signal MODE1 is at an H level and the second state signal MODE2 is at an H level. The PLD 100 is set in the fourth state when the first state signal MODE1 is at an H level and the second state signal MODE2 is at an L level.

With such a structure, in the middle of state transition, it is possible to prevent malfunction due to deviation of change time in the first state signal MODE1 and the second state signal MODE2, so that the reliability of the PLD can be improved.

The use of the method for driving a PLD can control a plurality of states, for example, states subdivided by the presence or absence of a configuration memory at the time of start of supply of power supply voltage. Further, it is possible to set configuration data in accordance with a plurality of states when power supply voltage is supplied intermittently.

In the method for driving a PLD, the PLD is changed into another state in accordance with a change in the first state signal or the second state signal when the first state signal and the second state signal are controlled. Thus, the reliability can be improved.

<3. Modification of Method for Driving PLD>

Next, modification of the method for driving a PLD is described.

Note that for illustrative purposes, in timing charts in FIGS. 3A and 3B and FIGS. 4A and 4B, supply of power supply voltage to the storage circuit 110 is started by switching the potential of the power supply line Power_ROM from an L level to an H level.

Figure 3A:
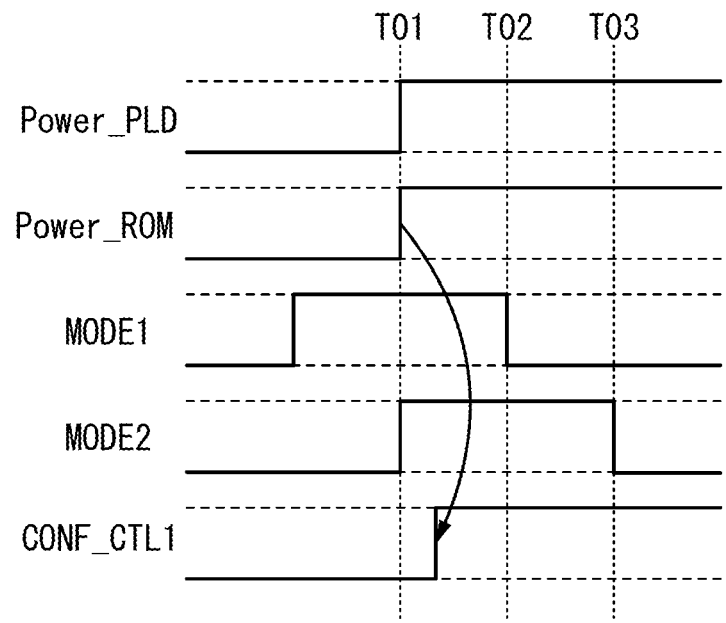
FIGS. 3A and 3B each illustrate a method for driving a PLD.
Figure 3B:
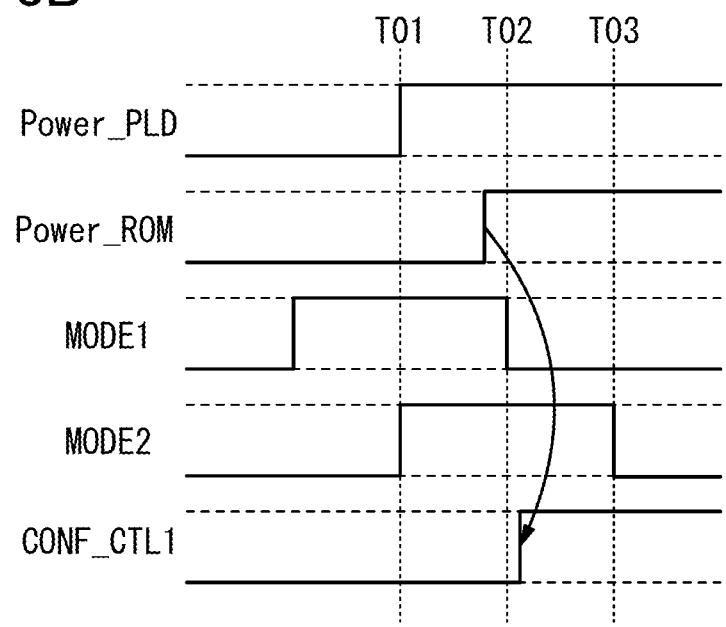

The timing chart in FIG. 3A differs from FIG. 2A in that the potential of the power supply line Power_PLD is switched from an L level to an H level and that the potential of the power supply line Power_ROM is switched from an L level to an H level.

As illustrated in FIG. 3A, in response to start of the supply of power supply voltage to the PLD 100, the supply of power supply voltage to the storage circuit 110 is started. Then, in response to switching of the potential of the power supply line Power_ROM from an L level to an H level, the signal line CONF_CTL1 to which the first configuration control signal is supplied is switched from an L level to an H level. Then, the PLD control circuit 101 starts to supply a clock signal and a start pulse to the word line driver circuit 103 and starts to supply a clock signal, a start pulse, and configuration data to the data line driver circuit 102 with switching from an L level to an H level of the potential of the signal line CONF_CTL1 used as a trigger signal. Note that in FIG. 3A, in a period from the time T01 to the time T02, the first configuration control signal is switched from an L level to an H level; however, the first configuration control signal may be switched from an L level to an H level in another period, such as a period from the time T02 to the time T03 in FIG. 3B, as long as the PLD control circuit 101 can effectively detect signal switching.

With such a structure, when the supply of power supply voltage to the storage circuit 110 is started almost at the same time as the start of the supply of power supply voltage to the PLD 100 at the time T01, configuration can be started right after the PLD 100 is set in the third state by a trigger signal generated in the storage circuit 110.

Note that it is effective to employ a transceiving sequence called a handshake transceiving sequence in which the PLD control circuit 101 receives the trigger signal, the PLD control circuit 101 transmits a response signal to the storage circuit 110, the storage circuit 110 receives the response signal, and then output of configuration data is started.

Note that the PLD control circuit 101 preferably receives the trigger signal after initialization is terminated, specifically, in the period from the time T02 to the time T03. The storage circuit 110 preferably starts to output configuration data after the time T03. If the above conditions are satisfied, the supply of power supply voltage to the storage circuit 110 can be started at time that is different from the time T01. In addition, the storage circuit 110 can be selected as appropriate so that the above conditions are satisfied, and the PLD control circuit 101 can receive the trigger signal in a period from the time T01 to the time T03. With such a structure, it is possible to prevent malfunction due to signal delay or the like without an increase in the number of signals input.

Figure 4A:
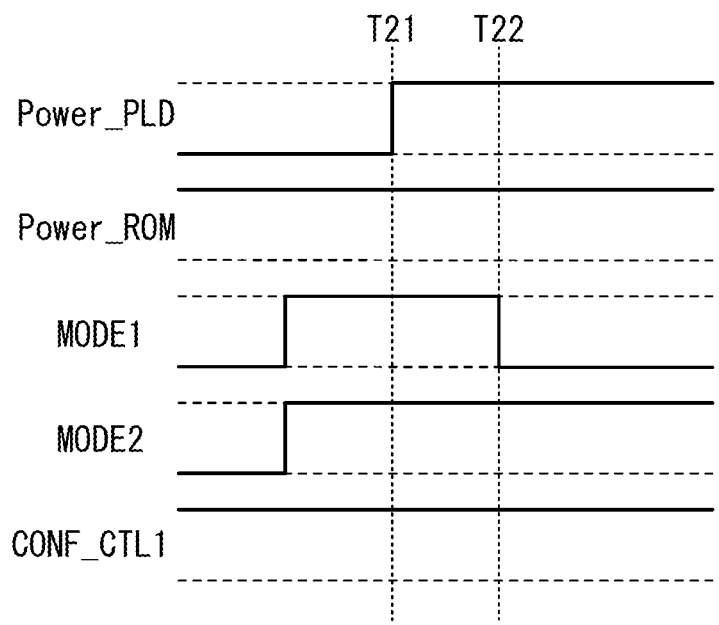
FIGS. 4A and 4B each illustrate a method for driving a PLD.

The timing chart in FIG. 4A differs from FIG. 2C in that when the potential of the power supply line Power_PLD is switched from an L level to an H level, the potential of the power supply line Power_ROM is kept at an H level.

As illustrated in the timing chart in FIG. 4A, at the time of the start of the supply of power supply voltage without configuration, it is possible to prevent generation of a trigger signal in response to the start of the supply of power supply voltage to the storage circuit 110. Thus, in the timing chart in FIG. 4A, it is possible to employ a structure where configuration is not started right after the PLD 100 is set in the third state. With such a structure, malfunction of the PLD 100 due to an unnecessary input-output signal can be prevented more reliably.

Figure 4B:
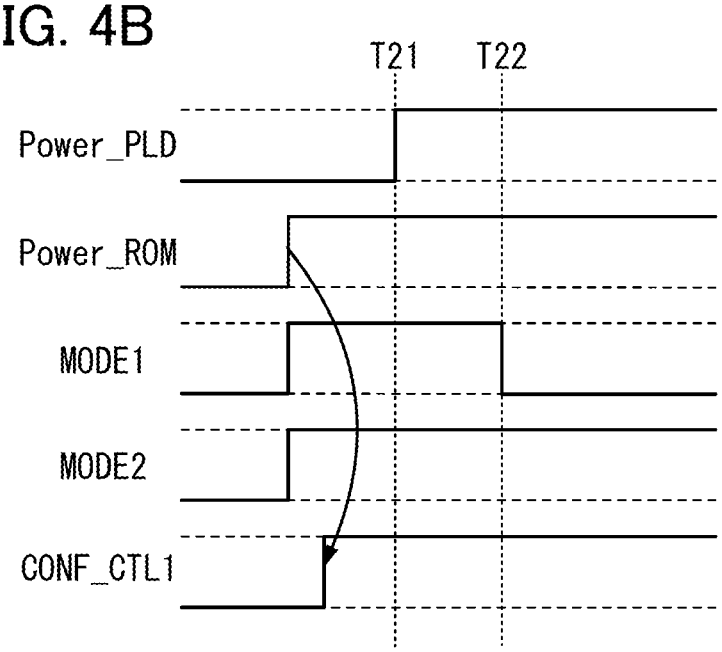

The timing chart in FIG. 4B differs from FIG. 2C in that when the potential of the power supply line Power_PLD is switched from an L level to an H level, the potential of the power supply line Power_ROM is switched from an L level to an H level before the time T21.

As illustrated in the timing chart in FIG. 4B, at the time of the start of the supply of power supply voltage to the PLD 100 without configuration, it is possible to employ a structure where the PLD 100 does not detect a trigger signal because power supply voltage has not been supplied to the PLD 100, though the trigger signal is generated in response to the start of the supply of power supply voltage to the storage circuit 110. Thus, even in the timing chart in FIG. 4B, it is possible to employ a structure where configuration is not started right after the PLD 100 is set in the third state as in the timing chart in FIG. 4A. With such a structure, malfunction of the PLD 100 due to an unnecessary input-output signal can be prevented more reliably.

<4. Details of Components in PLD>

Next, the details of the components included in the PLD are described.

<4-1. Structure of Logic Array>

Figure 5:
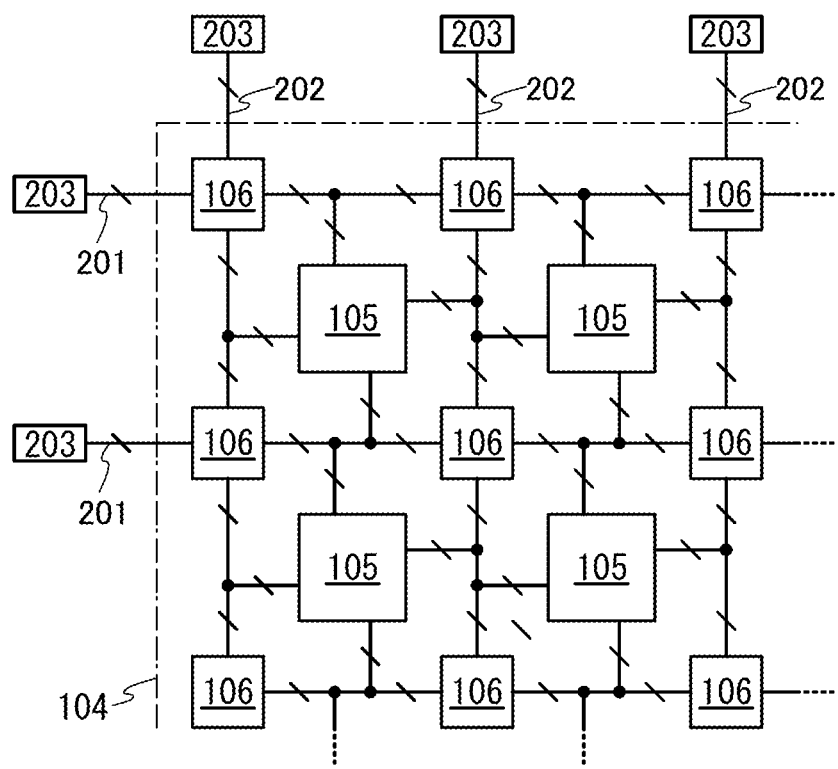
FIG. 5 illustrates a structure of a logic array.

FIG. 5 conceptually illustrates part of the logic array 104 in FIG. 1. The logic array 104 includes the plurality of LEs 105 arranged in an array. Here, the expression "arranged in an array" means the case where the logic elements are arranged at regular intervals, and the arrangement is not limited to that illustrated in FIG. 5.

A plurality of wirings are formed to surround the LEs 105. In FIG. 5, these wirings consist of a plurality of horizontal wiring groups 201 and a plurality of vertical wiring groups 202. A wiring group is a bundle of a plurality of wirings. The switch portion 106 is provided at an intersection of the horizontal wiring group 201 and the vertical wiring group 202. The horizontal wiring groups 201 and the vertical wiring groups 202 are connected to input-output terminals 203 to transmit and receive signals to and from a circuit provided outside the logic array 104.

Input-output terminals of the plurality of LEs 105 are connected to the horizontal wiring groups 201 and the vertical wiring groups 202 provided around the LEs 105. For example, in FIG. 5, the input-output terminals of the LEs 105 are connected to the horizontal wiring groups 201 and the vertical wiring groups 202 up and down, left and right. With the use of these input-output terminals, each of the LEs 105 can be connected to another LE 105.

<4-2. Structure of Switch Portion>

Figure 6A:
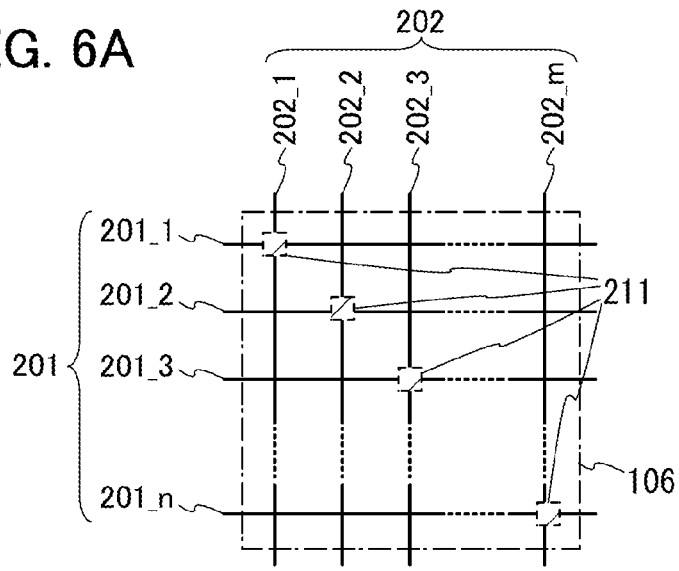
FIGS. 6A and 6B illustrate examples of a switch portion and a switch group.

A connection path between one LE 105 and another LE 105 is determined by a switch for switching connection between wirings provided in the switch portion 106. FIG. 6A is a magnified view of the switch portion 106. For example, in the case where the horizontal wiring group 201 includes n wirings (wirings 201_1 to 201_n) and the vertical wiring group 202 includes m wirings (wirings 202_1 to 202_m), the switch portion 106 is provided as illustrated in FIG. 6A. Specifically, switch groups 211 for switching connection between wirings are provided at intersections between the wirings in respective columns and rows.

Figure 6B:
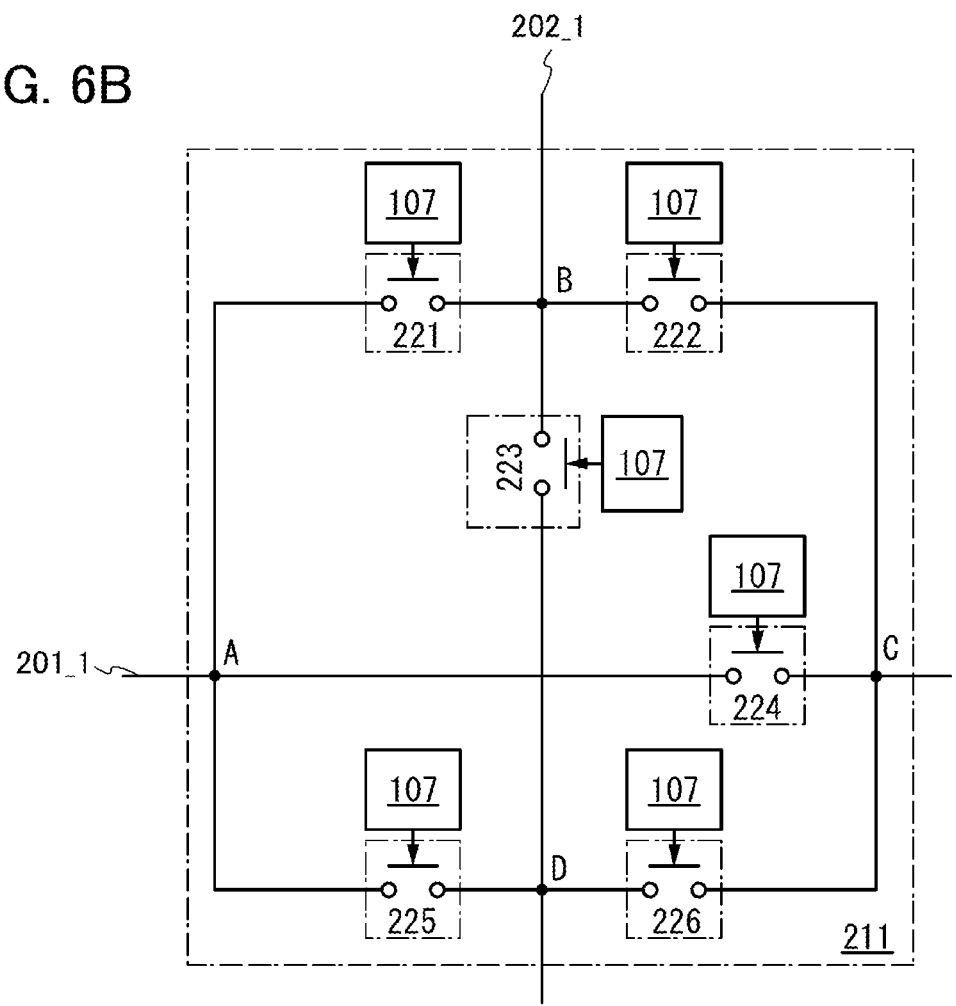

FIG. 6B illustrates the structure of the switch group 211. The switch group 211 is provided at an intersection of one wiring 201_1 included in the horizontal wiring group 201 and one wiring 202_1 included in the vertical wiring group 202 in FIG. 6A. The switch group 211 has a function of controlling connection between the wiring 201_1 included in the horizontal wiring group 201 and the wiring 202_1 included in the vertical wiring group 202.

Specifically, the switch group 211 includes switches 221 to 226. The switch 221 has a function of controlling connection between a node A of the wiring 201_1 and a node B of the wiring 202_1. The switch 222 has a function of controlling connection between a node C of the wiring 201_1 and the node B of the wiring 202_1. The switch 223 has a function of controlling connection between the node B and a node D of the wiring 202_1. The switch 224 has a function of controlling connection between the node A and the node C of the wiring 201_1. The switch 225 has a function of controlling connection between the node A of the wiring 201_1 and the node D of the wiring 202_1. The switch 226 has a function of controlling connection between the node C of the wiring 201_1 and the node D of the wiring 202_1.

The switches 221 to 226 are connected to the configuration memories 107, and configuration data is stored in the configuration memories 107. The on state and off state of each of the switches 221 to 226 are switched in accordance with the configuration data.

<4-3. Structure of LE>

Figure 7:
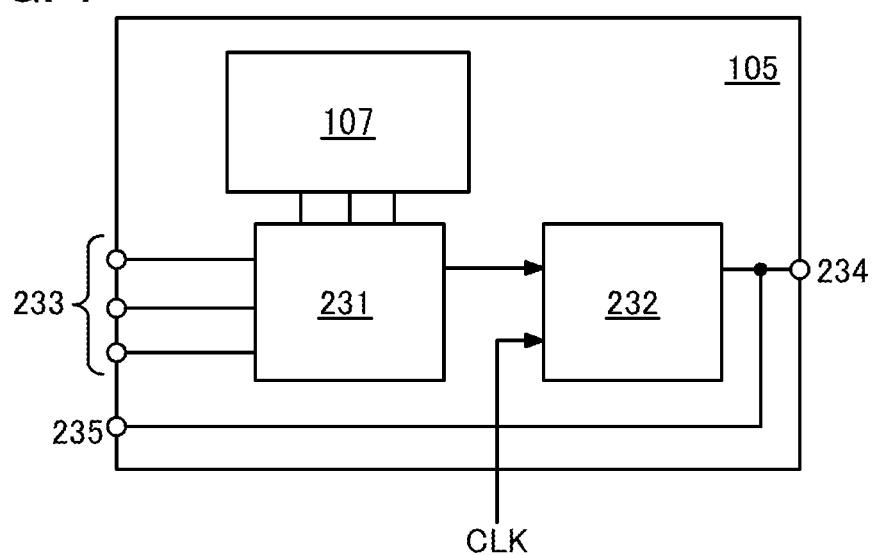
FIG. 7 illustrates a structure of an LE.

FIG. 7 is a block diagram of the LE 105 in FIG. 1. The LE 105 in FIG. 7 includes, for example, an LUT 231, a register 232, and the configuration memory 107.

A logic device determined by the LUT 231 varies depending on the content of configuration data stored in the configuration memory 107. When the configuration data is determined, one output value of the LUT 231 with respect to input values of a plurality of input signals supplied to input terminals 233 is determined. Then, the LUT 231 outputs a signal including the output value. The register 232 holds the signal output from the LUT 231 and outputs an output signal corresponding to the signal from a first output terminal 234 and a second output terminal 235 in synchronization with a clock signal CLK.

Note that the LE 105 may further include a multiplexer circuit. The multiplexer circuit can select whether the output signal from the LUT 231 goes through the register 232.

Further, the type of the register 232 may be determined by the configuration data. Specifically, the register 232 may have a function of any of a D register, a T register, a JK register, and an RS register depending on the configuration data.

<4-4. Structure of Configuration Memory>

Figure 8:
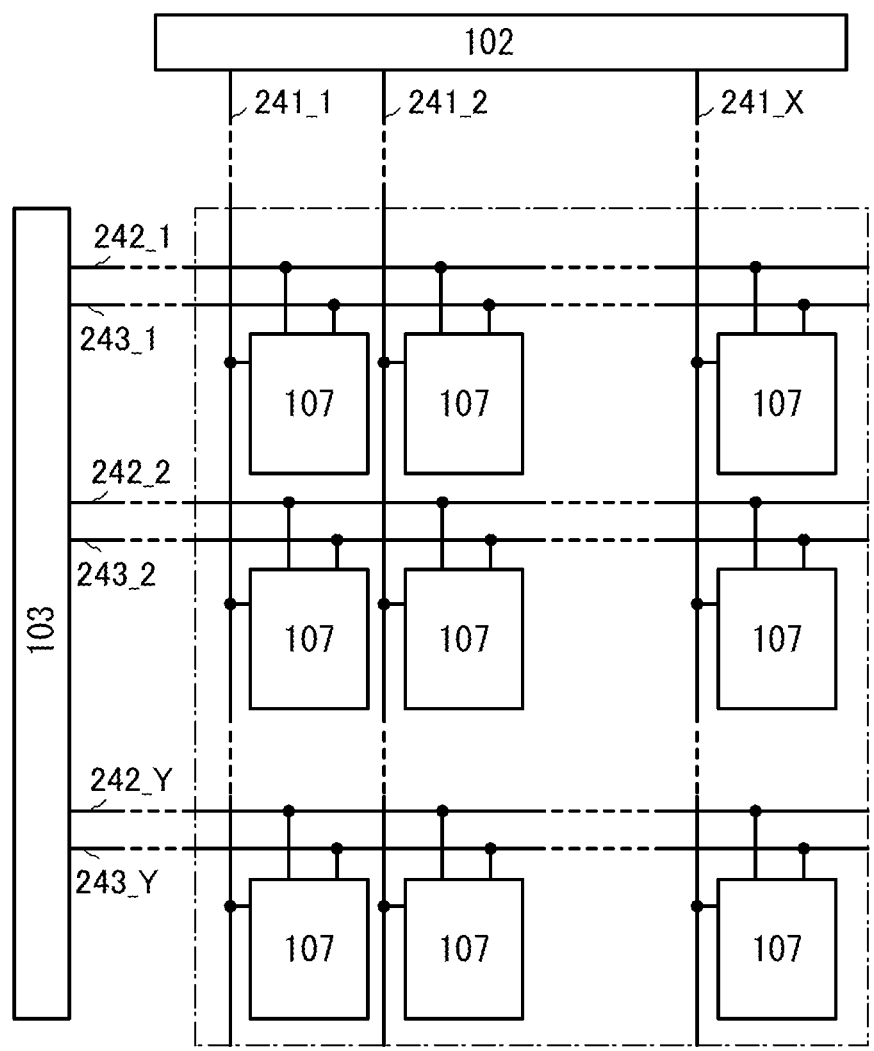
FIG. 8 illustrates a structure of a configuration memory.

FIG. 8 is a block diagram of the data line driver circuit 102, the word line driver circuit 103, and the configuration memories 107 in FIG. 1.

The block diagram in FIG. 8 illustrates the plurality of configuration memories 107 arranged in a matrix. Here, the expression "arranged in a matrix" means the case where the configuration memories 107 are arranged in a row direction and a column direction, and the arrangement is not limited to that illustrated in FIG. 8.

In FIG. 8, the configuration memories 107 are controlled by a plurality of data lines 241_1 to 241_X connected to the data line driver circuit 102, and a plurality of first word lines 242_1 to 242_Y and a plurality of second word lines 243_1 to 243_Y that are connected to the word line driver circuit 103. The configuration memory 107 can control the on state and off state of the switch and identification of the function of the LE by the LUT by setting configuration data.

The configuration memory 107 is a nonvolatile memory. An EPROM, an EEPROM, a ferroelectric random access memory, a magnetoresistive random access memory, a phase-change random access memory, a resistive random access memory, or the like can be used.

Note that a memory retaining data by utilizing low off-state current of a transistor including an oxide semiconductor is particularly preferable as a nonvolatile memory used as the configuration memory 107. By forming the configuration memory 107 with the use of a transistor including an oxide semiconductor, the configuration memory 107 can be formed through a manufacturing process of the transistor and transistors can be stacked, for example. This is highly advantageous in reducing cost.

Figure 9A:
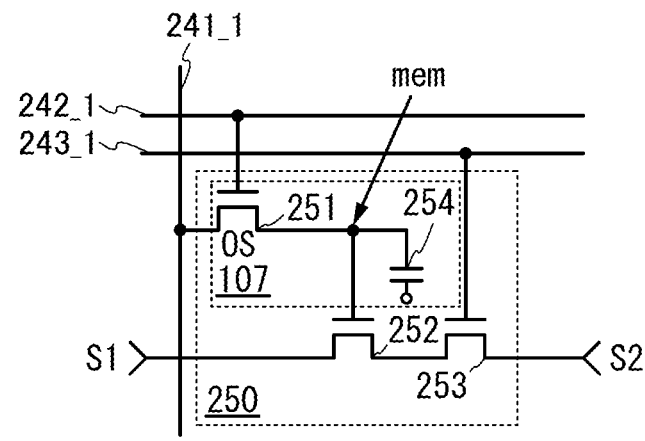
FIGS. 9A and 9B illustrate examples of configuration memories.

FIG. 9A illustrates a switch 250 that can be formed using transistors and includes the configuration memory 107. The switch 250 controls connection between a terminal S1 and a terminal S2 in accordance with configuration data retained in a node mem of the configuration memory 107.

The switch 250 in FIG. 9A includes a transistor 251, a transistor 252, a transistor 253, and a capacitor 254.

Figure 9B:
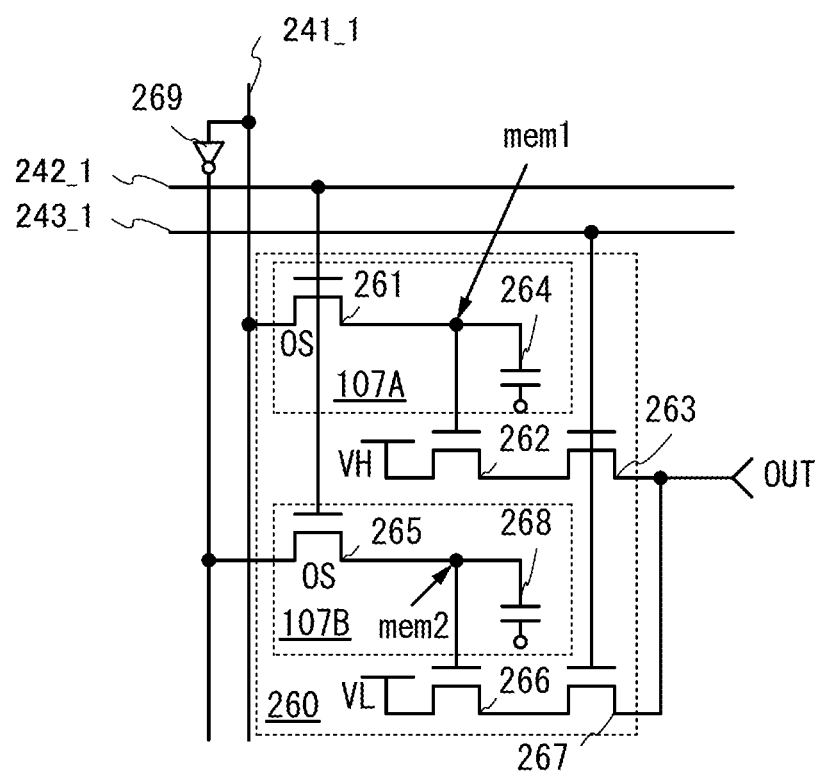

FIG. 9B illustrates a storage circuit 260 that can control an LUT or the like and includes configuration memories 107A and 107B. The configuration memories 107A and 107B control signals of an output terminal OUT in accordance with configuration data retained in nodes mem1 and mem2. A potential VH and a potential VL are signals for controlling the LUT.

The storage circuit 260 in FIG. 9B includes a transistor 261, a transistor 262, a transistor 263, a capacitor 264, a transistor 265, a transistor 266, a transistor 267, and a capacitor 268.

For each of the transistor 251, the transistor 261, and the transistor 265, a semiconductor material that has a wider band gap and lower intrinsic carrier density than silicon is used. An oxide semiconductor is used for a channel formation region of each of the transistor 251, the transistor 261, and the transistor 265. On the other hand, each of the transistor 252, the transistor 253, the transistor 262, the transistor 263, the transistor 266, and the transistor 267 preferably includes a semiconductor material such as silicon in a channel formation region so as to operate at higher speed than each of the transistor 251, the transistor 261, and the transistor 265.

Note that in the drawings, "OS" is written beside each of the transistor 251, the transistor 261, and the transistor 265 to indicate that each of the transistor 251, the transistor 261, and the transistor 265 includes an oxide semiconductor in the channel formation region.

The details of the switch 250 are described with reference to FIG. 9A. As illustrated in FIG. 9A, a gate of the transistor 251 is connected to the first word line 242_1. One of a source and a drain of the transistor 251 is connected to the data line 241_1. The other of the source and the drain of the transistor 251 is connected to a gate of the transistor 252 and the capacitor 254. One of a source and a drain of the transistor 252 is connected to the terminal S1. The other of the source and the drain of the transistor 252 is connected to one of a source and a drain of the transistor 253. A gate of the transistor 253 is connected to the second word line 243_1. The other of the source and the drain of the transistor 253 is connected to the terminal S2.

In the switch 250 in FIG. 9A, a potential corresponding to an H level or an L level is held in the node mem of the configuration memory 107 as configuration data. Configuration data can be stored in the node mem by using a transistor whose off-state current is extremely low as the transistor 251. In the switch 250, the on state and off state of the transistor 252 are controlled in accordance with the potential of configuration data. At timing of turning on the transistor 253, the on state and off state of the switch 250 can be controlled.

Since the node mem becomes floating in the switch 250 when the transistor 251 is off, a boosting effect described below can be expected. In other words, when the node mem is floating in the transistor 252, the potential of the node mem is increased by capacitance Cgs generated between the source and the gate of the transistor 252 as the potential of the terminal S1 is changed from an L level to an H level. The increase in potential of the node mem depends on the logic level of configuration data input to the gate of the transistor 252. Specifically, when configuration data written to the switch 250 is "0", that is, an L level, the transistor 252 is in a weak inversion mode, so that the capacitance Cgs that contributes to the increase in potential of the node mem includes capacitance Cos that is independent of the potential of the gate electrode, that is, the potential of the node mem. Specifically, the capacitance Cos includes overlap capacitance generated in a region where the gate electrode and the source region overlap with each other, and parasitic capacitance generated between the gate electrode and the source electrode, for example. On the other hand, when configuration data written to the switch 250 is "1", that is, an H level, the transistor 252 is in a strong inversion mode, so that the capacitance Cgs that contributes to the increase in potential of the node mem includes, in addition to the capacitance Cos, capacitance Cod generated between the gate electrode and the drain electrode and part of capacitance Cox generated between the channel formation region and the gate electrode. Thus, the capacitance Cgs that contributes to the increase in potential of the node mem at the time when the configuration data is "1" is larger than the capacitance Cgs at the time when the configuration data is "0." Consequently, the switch 250 can obtain a boosting effect such that the potential of the node mem at the time when the configuration data is "1" becomes higher than the potential of the node mem at the time when the configuration data is "0" with a change in the potential of the terminal 51. Accordingly, the transistor 252 can be reliably turned on and the switching speed of the switch 250 can be increased because the potential of the node mem can be increased by the boosting effect even when the potential of the node mem is decreased by the threshold voltage of the transistor 251 in the case where the configuration data is "1." The transistor 252 can be reliably turned off in the case where the configuration data is "0."

In one embodiment of the present invention, by lowering power supply voltage supplied to the PLD, even when the voltage of a signal input to the gate of the transistor 252 is lowered, that is, even when a potential applied to the gate is lowered, the switch 250 can correctly operate by the boosting effect. Thus, even when power supply voltage supplied to the PLD is lowered, it is possible to prevent a change in logic level of a signal output from the LE and to prevent malfunction of the PLD.

Next, the details of the storage circuit 260 are described with reference to FIG. 9B. As illustrated in FIG. 9B, a gate of the transistor 261 is connected to the first word line 242_1. One of a source and a drain of the transistor 261 is connected to the data line 241_1. The other of the source and the drain of the transistor 261 is connected to a gate of the transistor 262 and the capacitor 264. One of a source and a drain of the transistor 262 is connected to a wiring to which the potential VH is applied. The other of the source and the drain of the transistor 262 is connected to one of a source and a drain of the transistor 263. A gate of the transistor 263 is connected to the second word line 243_1. The other of the source and the drain of the transistor 263 is connected to the output terminal OUT. A gate of the transistor 265 is connected to the first word line 242_1. One of a source and a drain of the transistor 265 is connected to the data line 241_1 through an inverter circuit 269. The other of the source and the drain of the transistor 265 is connected to a gate of the transistor 266 and the capacitor 268. One of a source and a drain of the transistor 266 is connected to a wiring to which the potential VL is applied. The other of the source and the drain of the transistor 266 is connected to one of a source and a drain of the transistor 267. A gate of the transistor 267 is connected to the second word line 243_1. The other of the source and the drain of the transistor 267 is connected to the output terminal OUT.

In the storage circuit 260 in FIG. 9B, a potential corresponding to the combination of an H level and an L level or the combination of an L level and an H level is held in the nodes mem1 and mem2 of the configuration memories 107A and 107B as configuration data. Configuration data can be stored in the nodes mem1 and mem2 by using a transistor whose off-state current is extremely low as each of the transistors 261 and 265. In the storage circuit 260, the on state and off state of each of the transistors 262 and 266 are controlled in accordance with the potential of configuration data. At timing of turning on each of the transistors 263 and 267, a signal output from the output terminal OUT can be set to the potential VH or the potential VL.

Such a structure can reduce a read circuit and time required to read data from a storage circuit that stores plural pieces of configuration data. Consequently, the PLD in which configuration data can be switched at high speed can be provided.

<4-5. Features of Oxide Semiconductor Transistor>

Here, the features of a transistor including an oxide semiconductor are described. The transistor including an oxide semiconductor is an n-channel transistor. Further, oxygen vacancies in the oxide semiconductor might generate carriers. This might degrade the electrical characteristics and reliability of the transistor. For example, in some cases, the threshold voltage of the transistor is shifted in a negative direction, and drain current flows when gate voltage is 0 V. A transistor in which drain current flows when gate voltage is 0 V is referred to as a normally-on transistor, whereas a transistor in which substantially no drain current flows when gate voltage is 0 V is referred to as a normally-off transistor.

In view of the above, when an oxide semiconductor film is used, it is preferable that defects, typically oxygen vacancies in the oxide semiconductor film be reduced as much as possible. For example, it is preferable that the spin density of the oxide semiconductor film (the density of defects in the oxide semiconductor film) at a g-value of 1.93 in electron spin resonance spectroscopy in which a magnetic field is applied in parallel to the film surface be reduced to lower than or equal to the lower detection limit of measurement equipment. When the defects, typically the oxygen vacancies in the oxide semiconductor film are reduced as much as possible, the transistor can be prevented from being normally on, leading to an improvement in the electrical characteristics and reliability of the transistor.

The shift of the threshold voltage of a transistor in a negative direction is caused in some cases by hydrogen (including a hydrogen compound such as water) contained in an oxide semiconductor film as well as by oxygen vacancies. Hydrogen contained in the oxide semiconductor film reacts with oxygen bonded to a metal atom to be water and forms vacancies (also referred to as oxygen vacancies) in a lattice from which oxygen is released (or a portion from which oxygen is released). In addition, part of hydrogen reacts with oxygen. This generates electrons serving as carriers. Thus, a transistor including an oxide semiconductor film that contains hydrogen is likely to be normally on.

Accordingly, it is preferable that hydrogen be reduced as much as possible in the oxide semiconductor film of the transistor. Specifically, the concentration of hydrogen in the oxide semiconductor film that is measured by secondary ion mass spectrometry (SIMS) is lower than $5\times10^{18}$ atoms/cm$^3$, preferably lower than or equal to $1\times10^{18}$ atoms/cm$^3$, more preferably lower than or equal to $5\times10^{17}$ atoms/cm$^3$, still more preferably lower than or equal to $1\times10^{16}$ atoms/cm$^3$.

Further, the concentration of an alkali metal or an alkaline earth metal in the oxide semiconductor film that is measured by SIMS is lower than or equal to $1\times10^{18}$ atoms/cm$^3$, preferably lower than or equal to $2\times10^{16}$ atoms/cm$^3$. When an alkali metal or an alkaline earth metal is bonded to an oxide semiconductor, carriers are generated in some cases. This might lead to an increase in off-state current of the transistor.

Further, when nitrogen is contained in the oxide semiconductor, electrons serving as carriers are generated and carrier density is increased, so that the oxide semiconductor film easily becomes n-type. As a result, a transistor including the oxide semiconductor film that contains nitrogen is likely to be normally on. For this reason, nitrogen in the oxide semiconductor film is preferably reduced as much as possible. The concentration of nitrogen is preferably, for example, lower than or equal to $5\times10^{18}$ atoms/cm$^3$.

Further, when a Group 14 element such as silicon and carbon is contained in the oxide semiconductor film, electrons serving as carriers are generated and carrier density is increased, so that the oxide semiconductor film easily becomes n-type. Thus, the concentration of silicon in the transistor including the oxide semiconductor film that is measured by SIMS is lower than or equal to $3\times10^{18}$ atoms/cm$^3$, preferably lower than or equal to $3\times10^{17}$ atoms/cm$^3$. Note that at an interface, the concentration of carbon that is measured by SIMS is lower than or equal to $3\times10^{18}$ atoms/cm$^3$, preferably lower than or equal to $3\times10^{17}$ atoms/cm$^3$.

As described above, when the oxide semiconductor film that is highly purified by reducing impurities (e.g., hydrogen, nitrogen, silicon, carbon, an alkali metal, and an alkaline earth metal) as much as possible is used, the transistor can be prevented from being normally on, so that the off-state current of the transistor can be significantly reduced. Note that the highly purified oxide semiconductor can be regarded as an intrinsic semiconductor or a substantially intrinsic semiconductor.

In addition, the transistor is an enhancement transistor, and the oxide semiconductor film is an oxide semiconductor film on which impurity addition treatment for increasing conductivity by intentionally increasing carrier density is not performed. Thus, the carrier density of the oxide semiconductor film is equal to or lower than $1\times10^{17}/cm^3$, equal to or lower than $1\times10^{16}/cm^3$, equal to or lower than $1\times10^{15}/cm^3$, equal to or lower than $1\times10^{14}/cm^3$, or equal to or lower than $1\times10^{13}/cm^3$.

Note that various experiments can prove low off-state current of a transistor including a highly-purified oxide semiconductor film. For example, even when an element has a channel width of $1\times10^6$ μm and a channel length L of 10 μm, off-state current can be lower than or equal to the measurement limit of a semiconductor parameter analyzer, i.e., lower than or equal to $1\times10^{-13}$ A, at a voltage (drain voltage) across a source and a drain of 1 to 10 V. In that case, it can be seen that off-state current corresponding to a value obtained by division of the off-state current by the channel width of the transistor is lower than or equal to 100 zA/μm. In addition, a storage capacitor and a transistor were connected to each other and off-state current was measured using a circuit in which electric charge flowing to or from the storage capacitor is controlled by the transistor. In the measurement, a highly-purified oxide semiconductor film was used in the channel formation region of the transistor, and the off-state current of the transistor was measured from a change in the amount of electric charge of the storage capacitor per unit hour. As a result, it can be seen that, in the case where the voltage across a source electrode and a drain electrode of the transistor is 3 V, a lower off-state current of several tens of yoctoamperes per micrometer is obtained. Accordingly, the transistor including the highly-purified oxide semiconductor film has extremely low off-state current.

As described above, a transistor for retaining configuration data has low off-state current when an oxide semiconductor is used for a semiconductor layer. When a transistor having low off-state current is used, a change in potential corresponding to data that is caused by off-state current is small even when the data is retained for a long time.

<5. Action and Effect of Method for Driving PLD Disclosed in this Specification>

According to the method for driving a PLD disclosed in this specification, it is possible to specify the first to fourth states by switching two values of the first state signal MODE1 and the second state signal MODE2.

Thus, it is possible to set configuration data in accordance with a plurality of states when power supply voltage is supplied intermittently.

According to the method for driving a PLD disclosed in this specification, transition from the first state to the second state may be performed by changing only the first state signal MODE1. Transition from the second state to the third state may be performed by changing only the second state signal MODE2. Transition from the fourth state to the third state may be performed by changing only the first state signal MODE1. In other words, in the method for driving a PLD disclosed in this specification, the PLD can be changed into another state in accordance with a change in the first state signal or the second state signal.

Thus, in the middle of state transition, it is possible to prevent malfunction due to deviation of change time in the first state signal MODE1 and the second state signal MODE2. Consequently, the reliability of the PLD can be improved.

This embodiment can be combined with any of the structures described in the other embodiments as appropriate.

Embodiment 2

A PLD according to one embodiment of the present invention can be used for display devices, personal computers, or image reproducing devices provided with recording media (typically, devices that reproduce the content of recording media such as digital versatile discs (DVDs) and have displays for displaying the reproduced images). Further, as electronic devices that can include the PLD according to one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 10A to 10F illustrate specific examples of these electronic devices.

Figure 10A:
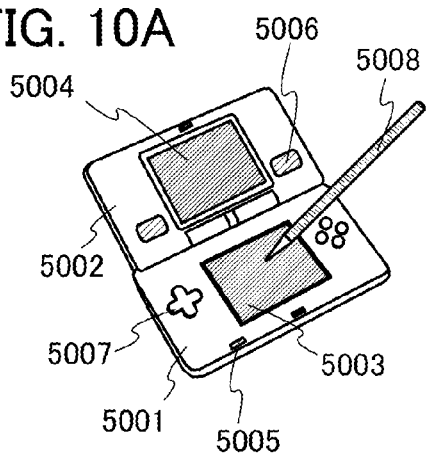
FIGS. 10A to 10F illustrate examples of electronic devices.

FIG. 10A illustrates a portable game machine, which includes a housing 5001, a housing 5002, a display portion 5003, a display portion 5004, a microphone 5005, a speaker 5006, an operation key 5007, a stylus 5008, and the like. Note that although the portable game machine in FIG. 10A includes the two display portions 5003 and 5004, the number of display portions included in the portable game machine is not limited thereto.

Figure 10B:
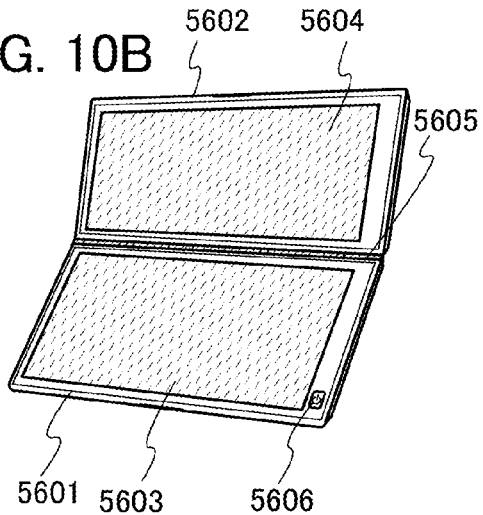

FIG. 10B illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel portion of a display device.

Figure 10C:
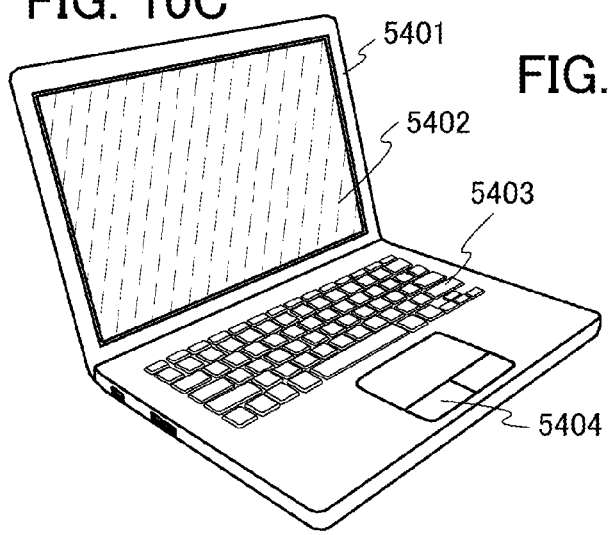

FIG. 10C illustrates a laptop, which includes a housing 5401, a display portion 5402, a keyboard 5403, a pointing device 5404, and the like.

Figure 10D:
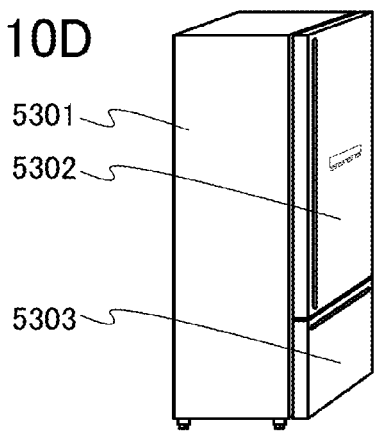

FIG. 10D illustrates an electric refrigerator-freezer, which includes a housing 5301, a refrigerator door 5302, a freezer door 5303, and the like.

Figure 10E:
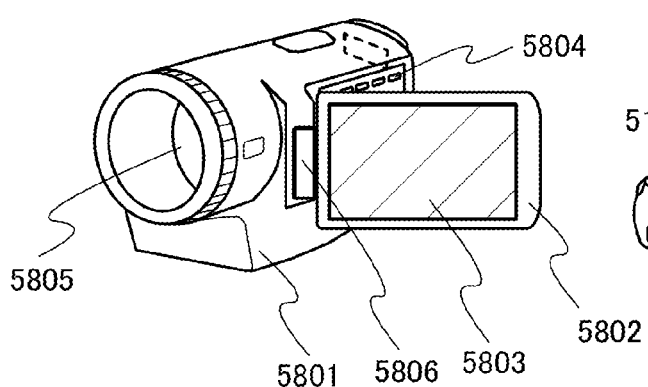

FIG. 10E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806.

Figure 10F:
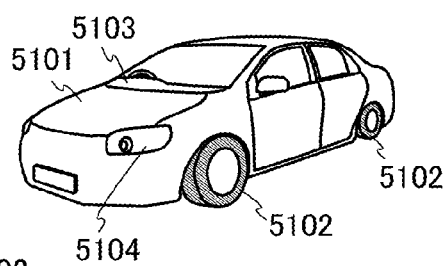

FIG. 10F illustrates an ordinary motor vehicle, which includes a car body 5101, wheels 5102, a dashboard 5103, lights 5104, and the like.

This embodiment can be combined with any of the other embodiments as appropriate.

This application is based on Japanese Patent Application serial No. 2012-230161 filed with Japan Patent Office on Oct. 17, 2012, the entire contents of which are hereby incorporated by reference.

What is claimed is:

1. A method for driving a programmable logic device comprising a logic element provided with a configuration memory and capable of stopping or starting supply of power supply voltage,
    wherein at the time of start of supply of power supply voltage with configuration, the programmable logic device is sequentially changed into a first state where configuration data is not set in the configuration memory, a second state where the configuration memory is initialized, and a third state where the configuration data can be set in the configuration memory,
    wherein at the time of start of supply of power supply voltage without the configuration, the programmable logic device is sequentially changed into a fourth state where the configuration data is not set in the configuration memory and the third state, and
    wherein the first to fourth states are switched to any one of the states by control of a first state signal and a second state signal.

2. The method for driving a programmable logic device, according to claim 1, wherein transition of the first to fourth states is performed in accordance with a change in one of the first state signal and the second state signal.

3. The method for driving a programmable logic device, according to claim 1, wherein the first state signal has a first level and the second state signal has a second level in the first state, the first state signal has the second level and the second state signal has the second level in the second state, the first state signal has the second level and the second state signal has the first level in the third state, and the first state signal has the first level and the second state signal has the first level in the fourth state.

4. The method for driving a programmable logic device, according to claim 1,
    wherein transition from the first state to the second state is performed by changing only the first state signal,
    wherein transition from the second state to the third state is performed by changing only the second state signal, and
    wherein transition from the fourth state to the third state is performed by changing only the first state signal.

5. The method for driving a programmable logic device, according to claim 1, wherein the supply of power supply voltage with configuration is started after power supply voltage is supplied to a storage circuit storing the configuration data.

6. The method for driving a programmable logic device, according to claim 1, wherein at the time of start of the supply of power supply voltage without configuration, power supply voltage is continuously supplied to a storage circuit storing the configuration data in a period during which supply of power supply voltage to the programmable logic device is stopped.

7. A programmable logic device comprising:
    a logic element and a switch portion, each provided with a configuration memory and configured to be capable of stopping or starting supply of power supply voltage,
    wherein at the time of start of supply of power supply voltage with configuration, the programmable logic device is configured to be sequentially changed into a first state where configuration data is not set in the configuration memory, a second state where the configuration memory is initialized, and a third state where the configuration data can be set in the configuration memory, and
    wherein at the time of start of supply of power supply voltage without the configuration, the programmable logic device is configured to be sequentially changed into a fourth state where the configuration data is not set in the configuration memory and the third state.

8. The programmable logic device according to claim 7, wherein the first to fourth states are switched to any one of the states by control of a first state signal and a second state signal.

9. The programmable logic device according to claim 8,
    wherein the first state signal has a first level and the second state signal has a second level in the first state,
    wherein the first state signal has the second level and the second state signal has the second level in the second state,
    wherein the first state signal has the second level and the second state signal has the first level in the third state, and
    wherein the first state signal has the first level and the second state signal has the first level in the fourth state.

10. The programmable logic device according to claim 7, wherein transition of the first to fourth states is performed in accordance with a change in one of a first state signal and a second state signal.

11. The programmable logic device according to claim 7, wherein the configuration memory comprises a transistor including an oxide semiconductor.

12. A semiconductor device comprising:
    a storage circuit storing configuration data;
    a programmable logic device electrically connected to the storage circuit through a plurality of signal lines; and
    a power supply control circuit configured to supply power supply voltage to the storage circuit and the programmable logic device and supply a first state signal and a second state signal to the programmable logic device,
    wherein the programmable logic device comprises a logic element and a switch portion, each provided with a configuration memory and configured to be capable of stopping or starting supply of power supply voltage,
    wherein at the time of start of supply of power supply voltage with configuration, the programmable logic device is configured to be sequentially changed into a first state where the configuration data is not set in the configuration memory, a second state where the configuration memory is initialized, and a third state where the configuration data can be set in the configuration memory, and
    wherein at the time of start of supply of power supply voltage without the configuration, the programmable logic device is configured to be sequentially changed into a fourth state where the configuration data is not set in the configuration memory and the third state.

13. The semiconductor device according to claim 12, wherein the first to fourth states are switched to any one of the states by control of the first state signal and the second state signal.

14. The semiconductor device according to claim 12, wherein transition of the first to fourth states is performed in accordance with a change in one of the first state signal and the second state signal.

15. The semiconductor device according to claim 12,
    wherein the first state signal has a first level and the second state signal has a second level in the first state, wherein the first state signal has the second level and the second state signal has the second level in the second state, wherein the first state signal has the second level and the second state signal has the first level in the third state, and wherein the first state signal has the first level and the second state signal has the first level in the fourth state.

16. The semiconductor device according to claim 12, wherein the supply of power supply voltage with configuration is started after power supply voltage is supplied to the storage circuit storing the configuration data.

17. The semiconductor device according to claim 12, wherein at the time of start of the supply of power supply voltage without configuration, power supply voltage is configured to be continuously supplied to a storage circuit storing the configuration data in a period during which supply of power supply voltage to the programmable logic device is stopped.

18. The semiconductor device according to claim 12, wherein the configuration memory comprises a transistor including oxide semiconductor.

\* \* \* \* \*